United States Patent

Sakai et al.

Patent Number: 6,039,511
Date of Patent: Mar. 21, 2000

[54] CARRYING APPARATUS FOR SPHERICAL OBJECTS

[75] Inventors: Nobuo Sakai; Migaku Ishida; Junichi Irie, all of Fukuoka, Japan

[73] Assignee: Mitsui High-tec Inc., Fukuoka, Japan

[21] Appl. No.: 09/112,382

[22] Filed: Jul. 9, 1998

[30] Foreign Application Priority Data

Aug. 22, 1997 [JP] Japan ................................ 9-226909

[51] Int. Cl.[7] ............................ B65G 53/00; B65G 53/08
[52] U.S. Cl. ................................................ 406/46; 406/68
[58] Field of Search .................................... 406/46, 68, 98, 406/19, 52, 64

[56] References Cited

U.S. PATENT DOCUMENTS

| | | | |
|---|---|---|---|
| 3,907,373 | 9/1975 | Jansen et al. | 302/14 X |
| 4,226,208 | 10/1980 | Nishida et al. | 118/706 X |
| 4,430,150 | 2/1984 | Levine et al. | 156/616 X |
| 4,481,019 | 11/1984 | Moreno | 55/96 X |
| 4,703,868 | 11/1987 | Shaw | 221/211 X |
| 5,044,837 | 9/1991 | Schmidt | 406/85 |
| 5,112,185 | 5/1992 | Koike | 414/786 |
| 5,278,097 | 1/1994 | Hotchkiss et al. | 437/164 X |
| 5,738,771 | 4/1998 | Yoshida | 204/298.24 |

FOREIGN PATENT DOCUMENTS

| | | | |
|---|---|---|---|
| 1122822 | 4/1966 | United Kingdom | 406/169 |

Primary Examiner—Christopher P. Ellis
Assistant Examiner—Kenneth W Bower
Attorney, Agent, or Firm—Greenblum & Bernstein, P.L.C.

[57] ABSTRACT

A apparatus for carrying spherical objects is adopted, which comprises: a housing 1; a cylindrical rotor 6 arranged in the housing, including a plurality of recess grooves 11 which are open to the outer circumferential surface, the plurality of recess grooves being arranged radially from the center of the rotor 6; a guide ring arranged in the housing, the guide ring 3 including an inner hole 5, the section of which is elliptical, in which the cylindrical rotor 6 is accommodated; a vane 12 slidably arranged in each recess groove 11; a first carrier atmosphere feeding pipe 16 connected with a converting section of the guide ring 3 in which the inner hole 5 is changed from a small diameter section to a large diameter section; a first carrier atmosphere discharging pipe 17 connected with a converting section of the guide ring 3 in which the inner hole 5 is changed from a large diameter section to a small diameter section; a second carrier atmosphere feeding pipe 18 connected with a converting section of the guide ring 3 in which the inner hole 5 is changed from a small diameter section to a large diameter section; and a second carrier atmosphere discharging pipe 19 connected with a converting section of the guide ring 3 in which the inner hole 5 is changed from a large diameter section to a small diameter section.

13 Claims, 5 Drawing Sheets

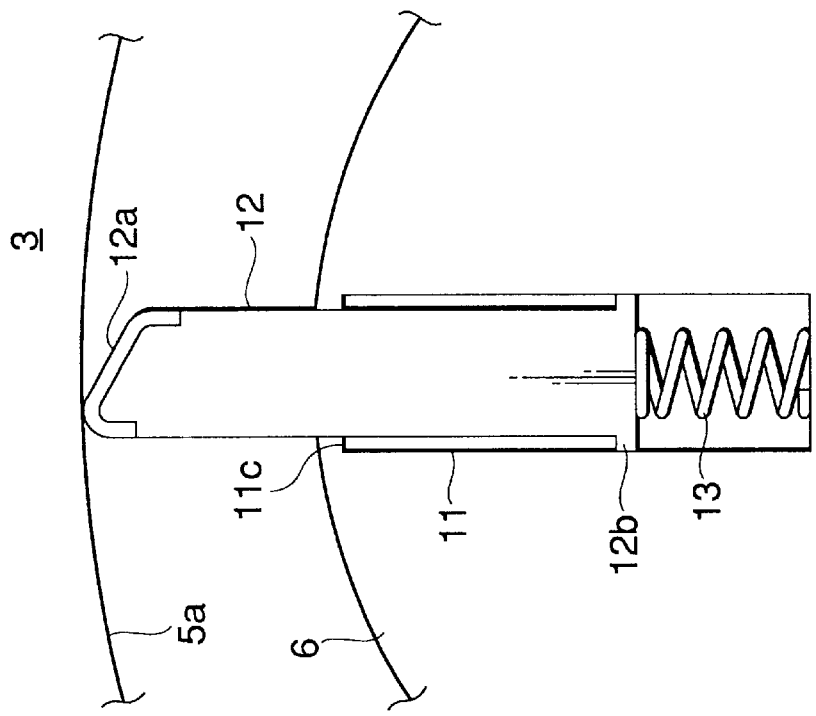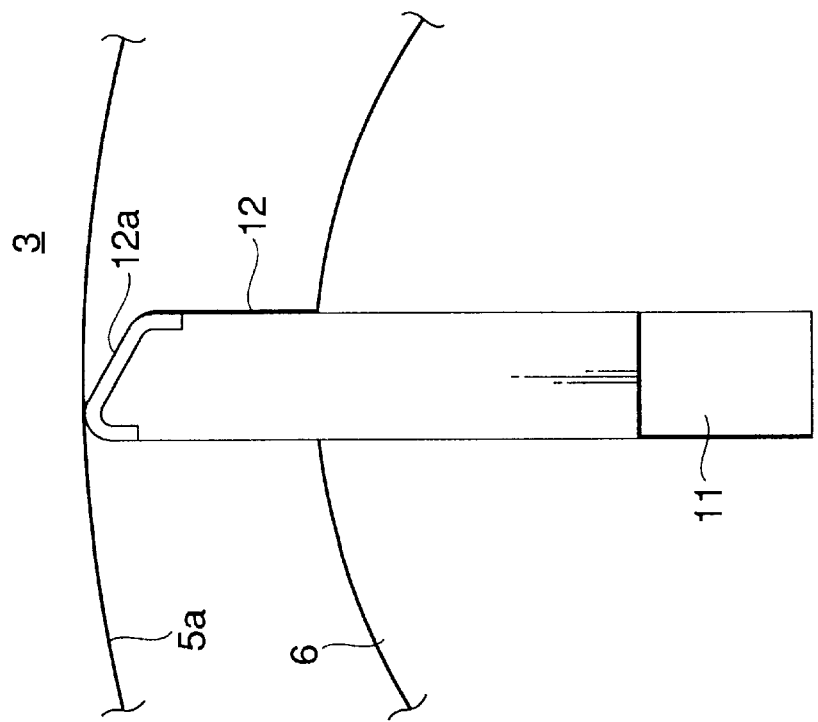

CARRYING APPARATUS FOR SPHERICAL OBJECTS

BACKGROUND OF THE INVENTION

1. Field of the Invention

The present invention relates to a carrying apparatus for spherical objects which is used when spherical objects such as spherical semiconductor are carried between regions having different atmospheres (fluid such as gas or liquid) each other while converting the carrier atmosphere. Priority of foreign application in Japan number 9-226,909 dated 22 Aug. 1997 is claimed.

2. Description of the Related Art

Conventionally, when a semiconductor device is made, a circuit pattern is formed on a silicon wafer, and it is diced in accordance with the necessity so as to form a semiconductor device. Recently, in the above circumstances, there is proposed a technique in which a circuit pattern is formed on a spherical semiconductor (ball semiconductor) made of single crystal silicon, the diameter of which is not more than 1 mm.

For example, in order to make a discrete device, which is used for a solar battery or an optical sensor, of a spherical single crystal silicon, or in order to make a semiconductor integrated circuit of a spherical single crystal silicon, it is necessary to provide various processes such as a mirror polishing process, cleaning process, thin film forming process, resist coating process, photolithography process and etching process in which the spherical single crystal silicon is treated. In order to make the spherical semiconductor element effectively, it is necessary to connect the above treating and carrying processes with each other so that they can be formed into a line.

However, in the processes, treatment is conducted not only in gas such as active gas or inert gas but also in liquid such as water or various solution. When the above processes are connected with each other so that they can be formed into a processing line, it is necessary to prevent an atmosphere, by which a workpiece is carried from an earlier-process, from being sent into a later-process. Therefore, it is necessary to remove the atmosphere of the earlier-process, from being sent into a later-process. Therefore, it is necessary to remove the atmosphere of the earlier-process from the workpiece when the workpiece is moved between the processes, and it is also necessary to convert the atmosphere of the earlier-process into the atmosphere of the later-process so that the workpiece can be carried in the atmosphere of the later-process. From the viewpoint of enhancing the productivity and quality, this work of converting the atmosphere must be conducted at high speed with high reliability.

SUMMARY OF THE INVENTION

It is an object of the present invention to positively convert an atmosphere between the before-process and the after-process, which are continuously arranged on a processing line, while spherical objects such as spherical objects of silicon are being carried at high speed, without causing a leakage of the atmosphere.

Also, it is an object of the present invention to compose the structure simply so that the occurrence of failure can be reduced and the maintenance can be made easy.

In order to accomplish the above objects, the present invention is to provide a carrying apparatus for spherical objects comprising: a housing; a cylindrical rotor 6 arranged in the housing, including a plurality of recess grooves which are open to the outer circumferential surface, the plurality of recess grooves being arranged radially from the center of the rotor 6; a guide ring arranged in the housing, the guide ring including an inner hole, the section of which is elliptical, in which the cylindrical rotor 6 is accommodated; a vane slidably arranged in each recess groove so that a forward end portion of the vane can be contacted with an inner wall of the inner hole; a first carrier atmosphere feeding pipe connected with a converting section of the guide ring in which the inner hole is changed from a small diameter section to a large diameter section; a first carrier atmosphere discharging pipe connected with a converting section of the guide ring in which the inner hole is changed from a large diameter section to a small diameter section; a second carrier atmosphere feeding pipe connected with a converting section of the guide ring in which the inner hole is changed from a small diameter section to a large diameter section; and a second carrier atmosphere discharging pipe connected with a converting section of the guide ring in which the inner hole is changed from a large diameter section to a small diameter section.

In the present invention, the inner hole provided in the guide ring is formed elliptical, and the rotor 6 accommodated in the inner hole is formed cylindrical. A clearance formed between them is divided by the vanes. Due to the above arrangement, while the rotor 6 is rotated by one turn, spherical objects and atmosphere are sucked from the before-process and the thus sucked atmosphere is discharged, and then atmosphere used in the successive process is sucked, and the spherical objects and the atmosphere sucked before are continuously discharged.

BRIEF DESCRIPTION OF THE DRAWINGS

FIGS. 4(*a*) and 4(*b*) are enlarged views showing a relation between the recess groove 11 and the vane 12.

DESCRIPTION OF THE PREFERRED EMBODIMENT

Referring to the accompanying drawings, the present invention will be explained below in accordance with an example of the present invention. However, it should be noted that the present invention is not limited to the specific example.

Figure 1:
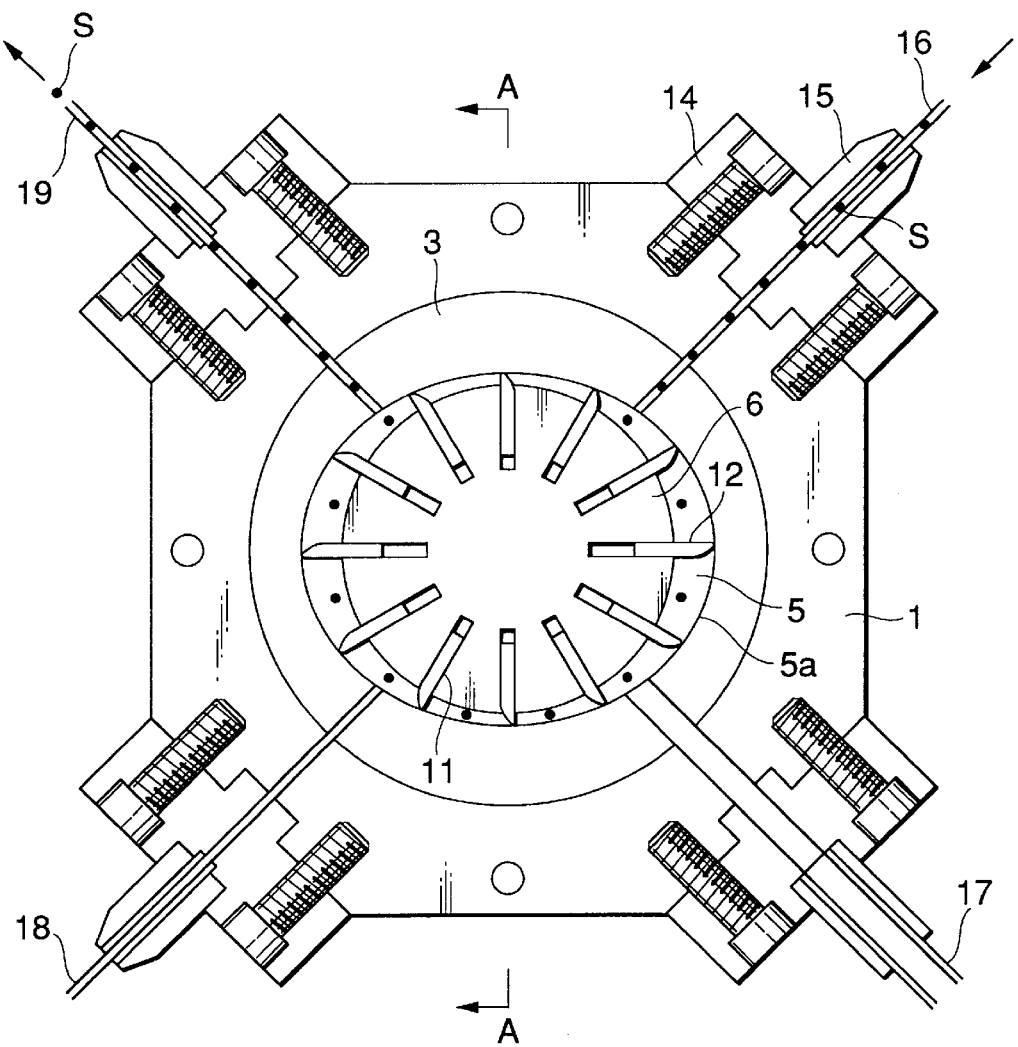
FIG. 1 is a front view showing an embodiment of the carrying apparatus for spherical objects of the present invention.
Figure 2:
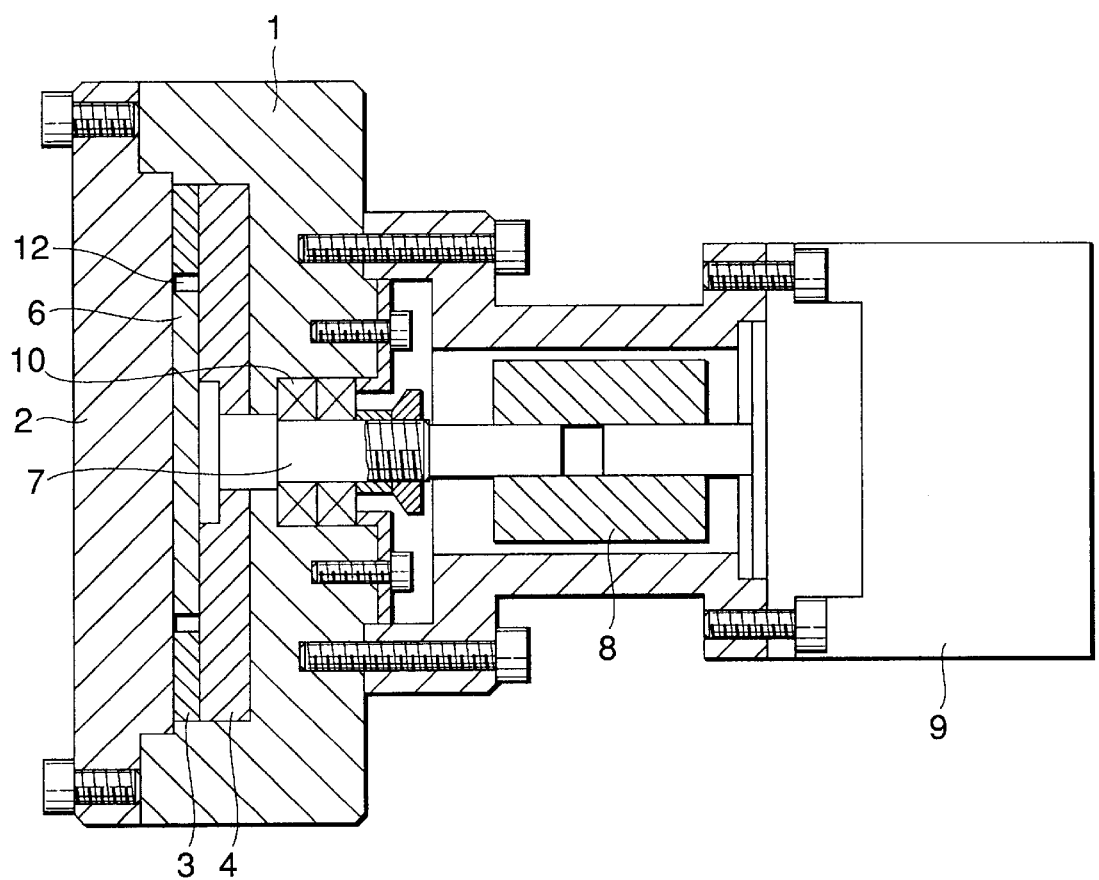
FIG. 2 is a cross-sectional view taken on line A—A in FIG. 1 of the apparatus for carrying spherical objects of the present invention.

FIG. 1 is a cross-sectional view of an example of the apparatus for carrying spherical objects of the present invention from which a cover is removed. FIG. 2 is a cross-sectional view taken on line A—A in FIG. 1.

In the drawing, reference number 1 is a housing, on the front side (the left in FIG. 2) of which a recess is formed, and a screw section for fixing the cover is formed in the periphery of the recess. As shown in FIG. 2, in the recess formed in the housing 1, a guide ring 3 is tightly attached via a back plate 4. This guide ring 3 is provided with an elliptical inner circumferential surface 5*a*. Due to the above structure, an inner hole 5, the section of which is elliptical, is formed penetrating the guide ring 3.

A cylindrical rotor 6 is put into the inner hole 5 under the condition that the center of the cylindrical rotor 6 is made to coincide with the center of the inner hole 5, and the cylindrical rotor 6 is connected with one end of the rotary shaft 7 which extends penetrating the back plate 4. As described above, one end of the rotary shaft 7 is connected with the rotor 6, and the other end of the rotary shaft 7 is connected with an output shaft of the motor 9 via a coupling 8. The rotary shaft 7 is rotatably supported by the housing 1 via a bearing 10. Accordingly, rotation of the motor 9 is transmitted to the rotor 6 via the rotary shaft 7.

On the other hand, a shown in FIG. 1, an adapter 15 is attached to each of four corners via a mounting bracket 14. The adapters 15 are respectively connected with a first carrier atmosphere feeding pipe 16, first carrier atmosphere discharging pipe 17, second carrier atmosphere feeding pipe 18, and second carrier atmosphere discharging pipe 19. These pipes penetrate the housing 1 and the guide ring 3, and extends to an inner circumferential surface 5a of the housing 3.

The other end portions of the first carrier atmosphere feeding pipe 16, first carrier atmosphere discharging pipe 17, second carrier atmosphere feeding pipe 18 and second carrier atmosphere discharging pipe 19 are respectively connected with a pretreatment device, first carrier atmosphere discharging device, second carrier atmosphere feeding device and successive treatment device.

In this example, a clearance formed between the inner circumferential surface 5a of the housing 3 and the rotor 6 is divided into a plurality of carrying chambers 20 by 12 pieces of vanes 12. In the present invention, it should be noted that the number of vanes 12 is not particularly limited to a specific value, however, it is preferable that 3 to 16 pieces of vanes are arranged in the apparatus of the invention. When the number of vanes 12 is not more than 2, it is impossible to introduce and discharge the spherical objects and carrier atmosphere. When the number of vanes 12 is not less than 16, the number of attaching portions to which the vanes are attached is increased. Therefore, the size of the rotor 6 is excessively increased. Intervals of the vanes 12 may be arbitrarily determined, that is, intervals of the vanes 12 are not limited in particular. However, in order to convert the atmosphere smoothly, it is preferable that the vanes 12 are arranged at regular intervals.

Figure 3:
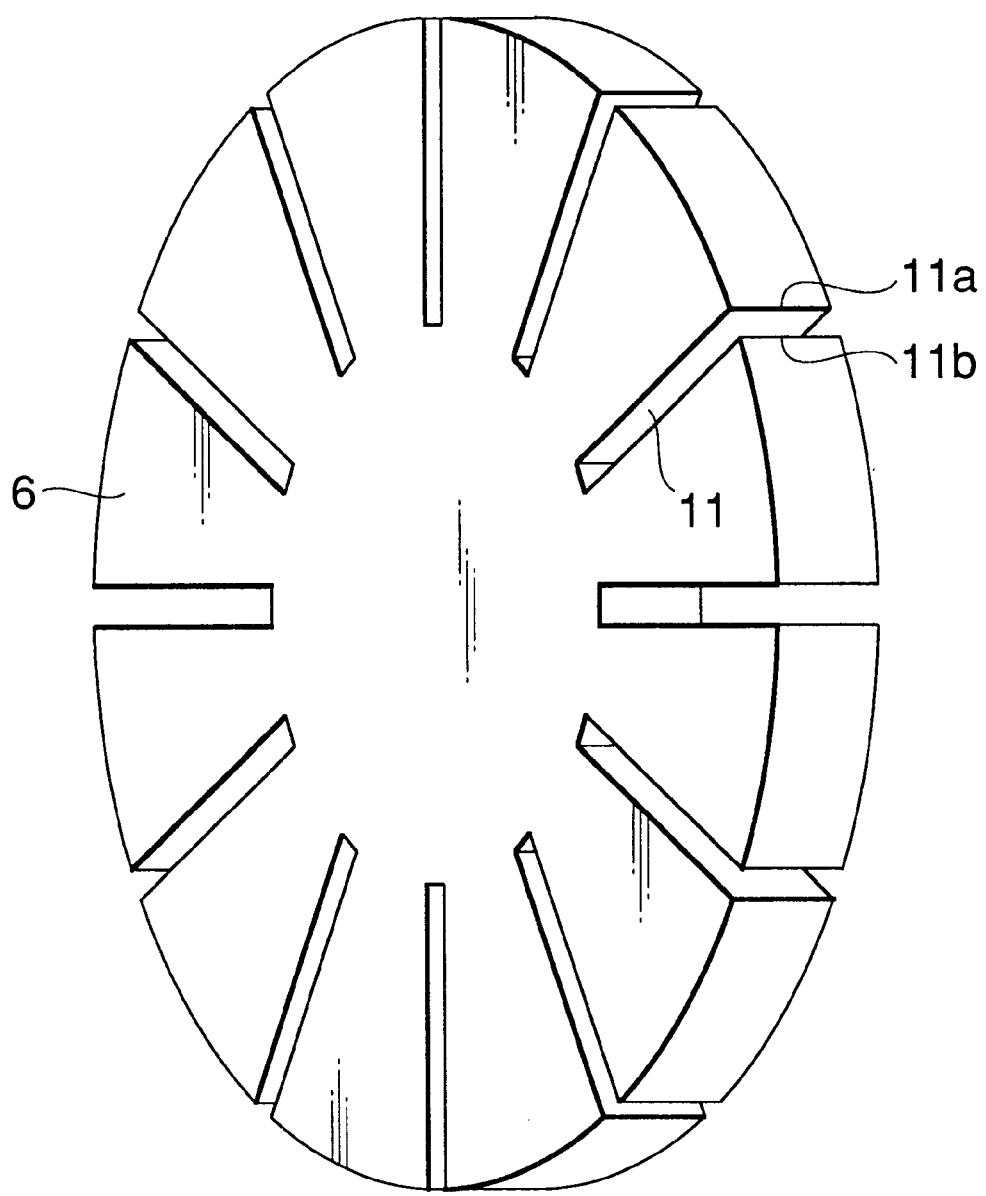
FIG. 3 is a perspective view showing a structure of the rotor 6.

FIG. 3 is a perspective view showing a structure of the rotor 6.

As the detail of structure is shown in FIG. 3, the rotor 6 includes a plurality of recess grooves 11 which are open to the outer circumferential surface. The recess grooves 11 are radially arranged from the center of the section of the rotor 6. The first side 11a of the opening portion of the recess groove 11 and the second side 11b are parallel with each other. In the example shown in FIG. 3, the first side 11a and the second side 11b are formed from straight lines which are parallel with a generating line of the cylindrical rotor 6. However, the first side 11a and the second side 11b may not be limited to straight lines. That is, the first side 11a and the second side 11b may be curved lines in accordance with the shape of the vane 12 described later. Further, the first side 11a and the second side 11b may not be parallel with each other.

FIG. 4 is an enlarged view showing a relation between the recess groove 11 formed in the rotor 6 and the vane 12.

The vane 12 is slidably inserted into the recess groove 11. In the case shown in FIG. 4, the vane 12 is formed into a substantial rectangular parallelepiped. However, when necessary, the vane 12 may be formed into other various shapes.

The vane 12 has a weight by which a portion of the vane 12 can be protruded from the recess groove 11 when a centrifugal force generated by the rotation of the rotor 6 acts on the vane 12. Length of the vane 12 is determined in such a manner that a forward end 12a of the vane 12 can slidably move on the overall circumference of the inner circumferential surface 5a (shown in FIG. 1) of the guide ring 3 while the vane 12 itself does not come out from the recess groove 11. It is preferable that the forward end 12a of the vane 12 is made of resin or metal, the sliding property of which is high.

FIG. 4(b) is a view showing an example in which an elastic section 13 is provided at a bottom of the vane 12. The elastic section 13 is not necessarily limited to a mechanical spring shown in the drawing, but any other elastic body such as rubber may be used for the elastic section 13. Due to the above arrangement, it is possible to positively press the forward end 12a of the vane 12 onto the inner circumferential surface 5a of the guide ring 3.

In this case, in the recess groove 11 on the surface side of the rotor 6, there is provided an engaging step section 11c for preventing the vane 12 from coming out from the recess groove 11. In this case, it is preferable that an engaging protrusion 12b for engaging with the engaging step section 11c is also provided at the bottom of the vane 12. Due to the above arrangement, it is possible to positively prevent the vane 12 from coming out from the recess groove 11 by the action of a centrifugal force generated by the rotation of the rotor 6.

Figure 5:
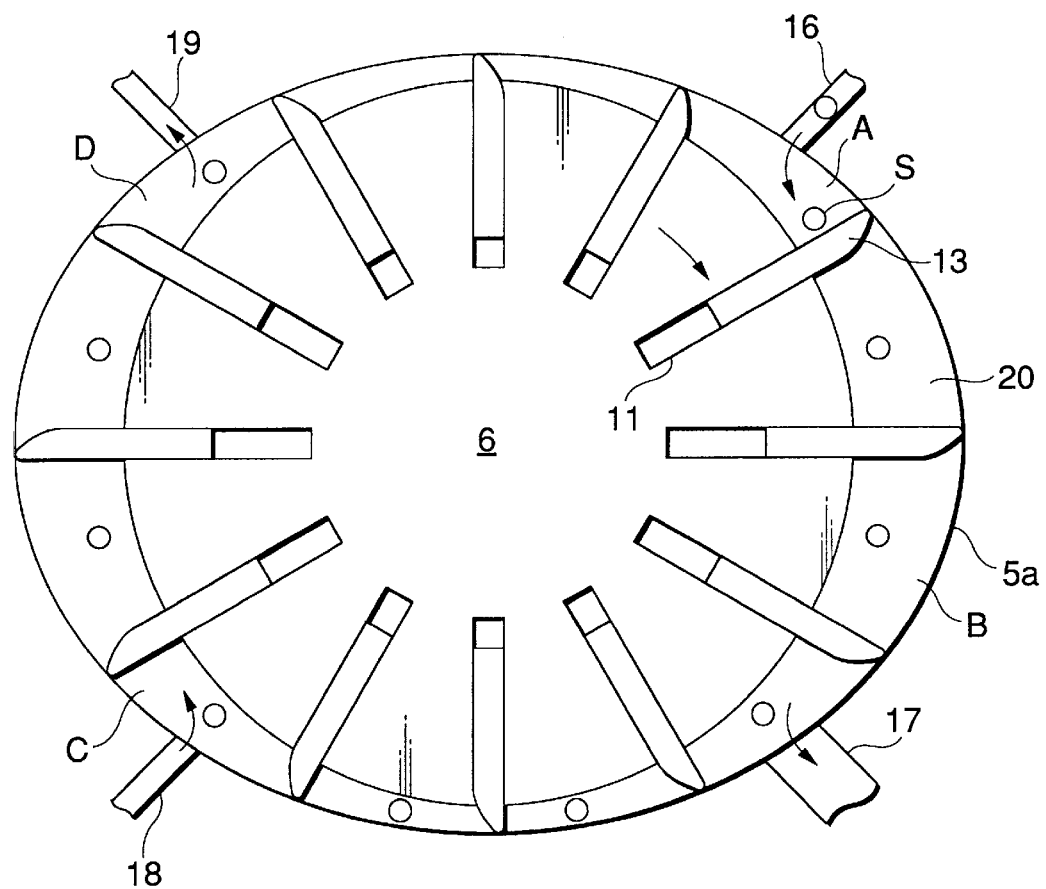
FIG. 5 is an enlarged cross-sectional view showing a center of the apparatus for carrying spherical objects.

FIG. 5 is an enlarged cross-sectional view showing a center of the apparatus for carrying spherical objects.

As described above, the first carrier atmosphere feeding pipe 16, first carrier atmosphere discharging pipe 17, second carrier atmosphere feeding pipe 18 and second carrier atmosphere discharging pipe 19 are open onto the inner circumferential surface 5a of the housing 3.

The first carrier atmosphere feeding pipe 16 is open to an inner circumferential surface 5a, which will be referred to as "a first expanding region A" hereinafter, on which the inner hole 5 is changed from a small diameter section to a large diameter section. The first carrier atmosphere discharging pipe 17 is open to the inner circumferential surface 5a, which will be referred to as "a first contracting region B" hereinafter, on which the inner hole 5 is changed from a large diameter section to a small diameter section. The second carrier atmosphere feeding pipe 18 is open to the inner circumferential surface 5a, which will be referred to as "a second expanding region C" hereinafter, on which the inner hole 5 is changed from a small diameter section to a large diameter section. The second carrier atmosphere discharging pipe 19 is open to the inner circumferential surface 5a, which will be referred to as "a second contracting region D" hereinafter, on which the inner hole 5 is changed from a large diameter section to a small diameter section.

Next, operation of the apparatus for carrying spherical objects of this example will be explained as follows.

When the motor 9 is set in motion by turning on a switch not shown in the drawing, the rotor 6 is rotated by the rotary shaft 7. By the action of the centrifugal force generated in the rotor 6, a portion of each vane 12 arranged in the recess groove 11 is protruded, so that a forward end 12a of the vane 12 comes into contact with the inner circumferential surface 5a. Accordingly, a clearance formed between the rotor 6 and the inner circumferential surface 5a can be divided into a plurality of carrying chambers 20.

When the rotor 6 reaches a steady state in which the rotor 6 is rotated at a sufficiently high speed, a strong centrifugal force acts on the vanes 12, so that the vanes 12 are slidably rotated on the inner circumferential surface 5a under the condition that the forward end 12a of each vane 12 is strongly pressed against the inner circumferential surface 5a. Therefore, each carrying chamber is maintained in a completely airtight condition. After it has been made sure that the above steady state was attained, a valve not shown is opened, so that the first carrier atmosphere feeding pipe 16 can be opened. The forward end 12a of each vane 12 is coated with protect film such as a nitrogen film, diamond film, or Teflon film.

Assume that a certain carrying chamber 20 has reached the first expanding region A in accordance with the rotation of the rotor 6. Since the first expanding region A is a region in which the small diameter section is changed into the large diameter section in the inner hole 5, a volume of the carrying chamber 20 is gradually increased in this region.

Therefore, a suction force is generated in the carrying chamber 20, and the first atmosphere used in the before-process not shown in the drawing and spherical objects of spherical silicon are sucked into the carrying chamber 20 via the first carrier atmosphere feeding pipe 16 which is open to the first expanding region A.

Successively when the rotor 6 is rotated, the carrying chamber 20 is moved from the first expanding region A to the first contracting region B. In the first contracting region B, the large diameter section is changed to the small diameter section in the inner hole 5 as described above. Accordingly, a volume of the carrying chamber 20 is gradually reduced in the first contracting region B.

Consequently, a force to discharge the first atmosphere from the carrying chamber 20 is generated, and the first atmosphere is discharged via the first carrier atmosphere discharging pipe 17, which is open to the first contracting region B, to a first carrier atmosphere recovery device not shown in the drawing. In this way, the first carrier atmosphere is removed from the periphery of the spherical objects.

In order to prevent the spherical objects from discharging into the first carrier atmosphere discharging pipe 17 together with the first carrier atmosphere at this time, it is preferable to cover an opening portion of the first carrier atmosphere discharging pipe 17 with a filter made of meshes or porous ceramics.

When the rotor 6 is further rotated, the carrying chamber is moved from the first contracting region B to the second expanding region C. In the second expanding region C, the small diameter section is changed to the large diameter section in the inner hole 5 as described before. Accordingly, a volume of the carrying chamber 20 is gradually increased.

Therefore, a suction force is generated again in the carrying chamber 20. Accordingly, the second atmosphere used in the successive process is sucked into the carrying chamber 20 from a second atmosphere feeding device not shown in the drawing via the second carrier atmosphere feeding pipe 18 which is open to the second expanding region C.

When the rotor 6 is further rotated, the carrying chamber 20 is moved from the second expanding region C to the second contracting region D. As described before, in the second contracting region D, the large diameter section is changed into the small diameter section in the inner hole 5. Accordingly, a volume of the carrying chamber 20 is gradually reduced in the second contracting region D.

Consequently, a force to discharge the spherical objects and the second atmosphere from the carrying chamber 20 is generated, and the second atmosphere is discharged via the second carrier atmosphere discharging pipe 19, which is open to the second contracting region D, to a successive treatment device not shown in the drawing.

As described above, each time the rotor 6 is rotated, the sucking of spherical objects and the first atmosphere, the discharging of the first atmosphere, the sucking of the second atmosphere and the discharging of spherical objects and the second atmosphere are repeated. In this way, conversion from the first atmosphere to the second atmosphere is continuously conducted. In this connection, the number of spherical objects held in each carrying chamber 20 divided by the vanes 12 may be arbitrarily determined, however, in order to convert the atmosphere positively, it is preferable that the number of spherical objects held in each carrying chamber 20 is one.

When inert gas, the temperature of which is controlled to a predetermined value, is fed into the second carrier atmosphere feeding pipe, it is possible to conduct heat treatment on the spherical objects during the carrying process. Due to the foregoing, it is possible to conduct heat treatment when a small quantity of inert gas, the temperature of which is controlled to a predetermined value, is consumed. Since a small quantity of inert gas is used, temperature control can be easily performed and further the temperature can be changed over at high speed.

When a predetermined reactive gas, the temperature of which is controlled to a predetermined value, is fed into the second carrier atmosphere feeding pipe, it is possible to form an oxide film, polycrystalline silicon film or refractory metal such as titanium and tungsten by the CVD method. When the above device is used, it is possible to form a film by feeding a very small quantity of gas, and further it is easy to control the quality and thickness of a film to be formed.

When oxygen gas or nitrogen gas, the temperature of which is controlled to a high value, is used as the reactive gas, it is easy to form an oxide film or nitride film while the spherical semiconductor is accommodated and carried in each carrying chamber 20 filled with the atmosphere gas.

When one or more set of the carrier atmosphere feeding pipe and carrier atmosphere discharging pipe are provided and gas of a different composition is fed to each carrier atmosphere feeding pipe, it is easy to successively form an oxide film and nitride film while each spherical semiconductor is accommodated and carried, and also it is easy to successively form a polycrystalline silicon film and tungsten film in such a manner that thus formed films can be laminated on each other. In this way, it is very easy to form an electrode of the polyside structures.

Further, the above second carrier atmosphere feeding pipe includes a closing means for closing the accommodating chamber. Therefore, even when the accommodating chamber arrives at the position of the second carrier atmosphere feeding pipe, the spherical semiconductor is not taken out from the accommodating chamber and passes through it. Accordingly, before the spherical semiconductor is taken out from the accommodating chamber, it can be rotated round the cylindrical rotor 6 by a plurality of turns, that is, when one spherical single crystal silicon is rotated by two turns, the heat treatment time can be adjusted.

When a plurality of the gas atmosphere feeding pipes and discharging pipes are provided, the first reactive gas, the temperature of which is controlled to a predetermined value, is fed to the spherical single crystal silicon from the first gas atmosphere feeding pipe, so that the first film is formed. Successively, the second reactive gas, the temperature of which is controlled to a predetermined value, is fed to the spherical single crystal silicon from the second gas atmosphere feeding pipe, so that the second film is formed. Due tot he above arrangement, when the spherical single crystal silicon is rotated by a plurality of turns without being picked up, it is easy to form a super lattice in which a plurality of ultra-thin film, the thickness of which is one atomic layer, are laminated.

The above explanations are made for a case in which gas is fed and discharged. However, it is possible to apply the invention to a case in which liquid is fed and discharged.

When the device of the present invention is used, the following effects can be provided.

(1) It is possible to continuously convert the atmosphere carried together with the spherical object. Therefore, the conversion of the atmosphere can be accomplished at high speed, and the productivity is very high.

(2) The device itself has a function of sucking and discharge. Therefore, it is unnecessary to provide a sucking and discharging device. Accordingly, the number of parts composing the device can be reduced, and the failure rate can be lowered, so that the maintenance can be easily performed.

(3) The sucking position and discharging position of the atmosphere are different from each other. Accordingly, there is no possibility that one atmosphere is mixed with another atmosphere, and conversion of the atmosphere can be positively performed.

What is claimed is:

1. An apparatus for carrying spherical objects comprising:
   a housing;
   a cylindrical rotor arranged in the housing, including a plurality of recess grooves which are open to the outer circumferential surface, the plurality of recess grooves being arranged radially from the center of the rotor;
   a guide ring arranged in the housing, the guide ring including an inner hole, the section of which is elliptical, in which the cylindrical rotor is accommodated;
   a plurality of vanes slidably arranged in each recess groove so that a forward end portion of each of the vanes can be contacted with an inner wall of the inner hole;
   a first carrier atmosphere feeding pipe connected with a converting section of the guide ring in which the inner hole is changed from a small diameter section to a large diameter section;
   a first carrier atmosphere discharging pipe connected with a converting section of the guide ring in which the inner hole is changed from a large diameter section to a small diameter section;
   a second carrier atmosphere feeding pipe connected with a converting section of the guide ring in which the inner hole is changed from a small diameter section to a large diameter section; and
   a second carrier atmosphere discharging pipe connected with a converting section of the guide ring in which the inner hole is changed from a large diameter section to a small diameter section.

2. The apparatus for carrying spherical objects according to claim 1, wherein each of the vanes has a weight by which a portion of the vane can be protruded from the recess groove when a centrifugal force generated by the rotation of the rotor acts on the vane.

3. The apparatus for carrying spherical objects according to claim 1, wherein one spherical object is fed into and discharged from each accommodating chamber formed between the vanes.

4. The apparatus for carrying spherical objects according to claim 1, wherein each of the vanes includes an elastic section at the bottom, and a portion of the vane can be protruded by the action of the elastic section.

5. The apparatus for carrying spherical objects according to claim 4, wherein the elastic section is composed of a mechanical spring.

6. The apparatus for carrying spherical objects according to claim 4, wherein the vane is made of resin or metal, the sliding property of which is high.

7. The apparatus for carrying spherical objects according to claim 1, wherein the first carrier atmosphere feeding pipe is connected with a spherical object feeding pipe for feeding a spherical object, and the spherical semiconductor is fed one by one into the accommodating chamber formed by two vanes, which are adjacent to each other, the outer circumferential surface of the cylindrical rotor, and the inner circumferential surface of the guide ring.

8. The apparatus for carrying spherical objects according to claim 7, wherein the second carrier atmosphere feeding pipe is connected with the discharge pipe, and the spherical semiconductor is discharged from the accommodating chamber so that it can be carried to the successive process.

9. The apparatus for carrying spherical objects according to claim 7, where the second carrier atmosphere feeding pipe feeds inert gas, the temperature of which is controlled to a predetermined value.

10. The apparatus for carrying spherical objects according to claim 7, where the second carrier atmosphere feeding pipe feeds reactive gas, the temperature of which is controlled to a predetermined value.

11. The apparatus for carrying spherical objects according to claim 10, wherein gas containing nitrogen, the temperature of which is controlled to a nitriding treatment temperature, is fed into the second carrier atmosphere feeding pipe, and the accommodating chamber functions as a nitriding treatment chamber in which the spherical semiconductor is accommodated and annealed by nitrogen while it is being carried.

12. The apparatus for carrying spherical objects according to claim 10, wherein the device further includes one or more set of the carrier atmosphere feeding pipe and carrier atmosphere discharging pipe, and gas of different composition is fed to each carrier atmosphere feeding pipe.

13. The apparatus for carrying spherical objects according to claim 10, wherein the above second carrier atmosphere feeding pipe includes a closing means for closing the accommodating chamber, even when the accommodating chamber arrives at the position of the second carrier atmosphere feeding pipe, the spherical semiconductor is not taken out from the accommodating chamber and passes through it, and before the spherical semiconductor is taken out from the accommodating chamber, it can be rotated round the cylindrical rotor by a plurality of turns.

* * * * *